United States Patent
Wincheski et al.

(10) Patent No.: US 7,129,467 B2
(45) Date of Patent: Oct. 31, 2006

(54) CARBON NANOTUBE BASED LIGHT SENSOR

(75) Inventors: Russell A. Wincheski, Williamsburg, VA (US); Jan M. Smits, Monument, CO (US); Jeffrey D. Jordan, Williamsburg, VA (US); Anthony Neal Watkins, Hampton, VA (US); JoAnne L. Ingram, Norfolk, VA (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 19 days.

(21) Appl. No.: 10/943,831

(22) Filed: Sep. 10, 2004

(65) Prior Publication Data

US 2006/0054788 A1    Mar. 16, 2006

(51) Int. Cl.
*H01L 31/00* (2006.01)
(52) U.S. Cl. .................................... 250/214.1; 977/954
(58) Field of Classification Search ............. 250/214.1, 250/214 R; 257/448; 977/742, 932, 953, 977/954
See application file for complete search history.

(56) References Cited

U.S. PATENT DOCUMENTS

| | | |
|---|---|---|
| 6,700,550 B1 | 3/2004 | Crowley |
| 6,724,064 B1 | 4/2004 | Watanabe et al. |
| 6,750,438 B1 | 6/2004 | Jordan |
| 6,765,190 B1 | 7/2004 | Jordan |
| 2003/0197120 A1 | 10/2003 | Miyamoto |
| 2004/0004485 A1 | 1/2004 | Lee et al. |
| 2005/0036905 A1* | 2/2005 | Gokturk ............ 422/55 |

OTHER PUBLICATIONS

Collins, J.E., et al., Optical Switching of Single-Wall Carbon Nanotube Absorption Through Field Gating.
Plewa, Joseph, et al., Processing Carbon Nanotubes with Holographic Optical Tweezers, Feb. 14, 2004.
Saito, R., et al., Optical Properites and Resonant Raman Spectroscopy of Carbon Nanotubes, Nanotube 02 Workshop, Jun. 2002.
Set, S., et al., Carbon Nanotube-Based Saturable Absorber Shows Promise for Ultra-Fast, 2R Regeneration Apps, Comms Design.
Set, S., et al., Carbon Nanotubes for Optical Communications, Nanotube Photonics.
Coated Nanotubes Record Light, TRN The Latest Technology Research News, pp. 1-2.
Alexander Star, Yu Lu, Keith Bradley, and George Gruner, Nanotube Optoelectronic Memory Devices, Nano Letters, 2004, vol. 4, No. 9, 1587-1591.

* cited by examiner

*Primary Examiner*—Thanh X. Luu
(74) *Attorney, Agent, or Firm*—Helen M. Galus

(57) ABSTRACT

A light sensor substrate comprises a base made from a semi-conductive material and topped with a layer of an electrically non-conductive material. A first electrode and a plurality of carbon nanotube (CNT)-based conductors are positioned on the layer of electrically non-conductive material with the CNT-based conductors being distributed in a spaced apart fashion about a periphery of the first electrode. Each CNT-based conductor is coupled on one end thereof to the first electrode and extends away from the first electrode to terminate at a second free end. A second or gate electrode is positioned on the non-conductive material layer and is spaced apart from the second free end of each CNT-based conductor. Coupled to the first and second electrode is a device for detecting electron transfer along the CNT-based conductors resulting from light impinging on the CNT-based conductors.

36 Claims, 7 Drawing Sheets

CARBON NANOTUBE BASED LIGHT SENSOR

ORIGIN OF THE INVENTION

The invention described herein was made in the performance of work under NASA contract number NAS1-00135 and by employees of the United States Government and is subject to the provisions of Section 305 of the National Aeronautics and Space Act of 1958, as amended, Public Law 85-566 (72 Stat. 435; 42 U.S.C. § 2457) and 35 U.S.C. § 202, and may be manufactured and used by or for the Government for governmental purposes without the payment of any royalties thereon or therefore. In accordance with 35 U.S.C. § 202, the contractor elected not to retain title.

RELATED FIELD

This embodiment relates to light sensors. More specifically, the embodiment is a carbon nanotube-based light sensor.

SUMMARY OF THE EMBODIMENT OF THE INVENTION

A light sensor has a substrate defined by a base made from a semi-conductive material and a layer of an electrically non-conductive material on a surface of the base. A first electrode and a plurality of carbon nanotube (CNT)-based conductors are on the layer of electrically non-conductive material. The CNT-based conductors are distributed in a spaced apart fashion about a periphery of the first electrode with each CNT-based conductor being coupled on one end thereof to the first electrode and extending substantially perpendicularly away from the first electrode to terminate at a second end thereof. Each CNT-based conductor comprises at least one CNT. A second electrode on the layer of electrically non-conductive material is positioned to be spaced apart from the second end of each of CNT-based conductor. Coupled to the first and second electrode is a device for detecting a quantity indicative of electron transfer along the CNT-based conductors. Such electron transfer is indicative of an amount of light impinging on the CNT-based conductors.

DETAILED DESCRIPTION

Figure 1:
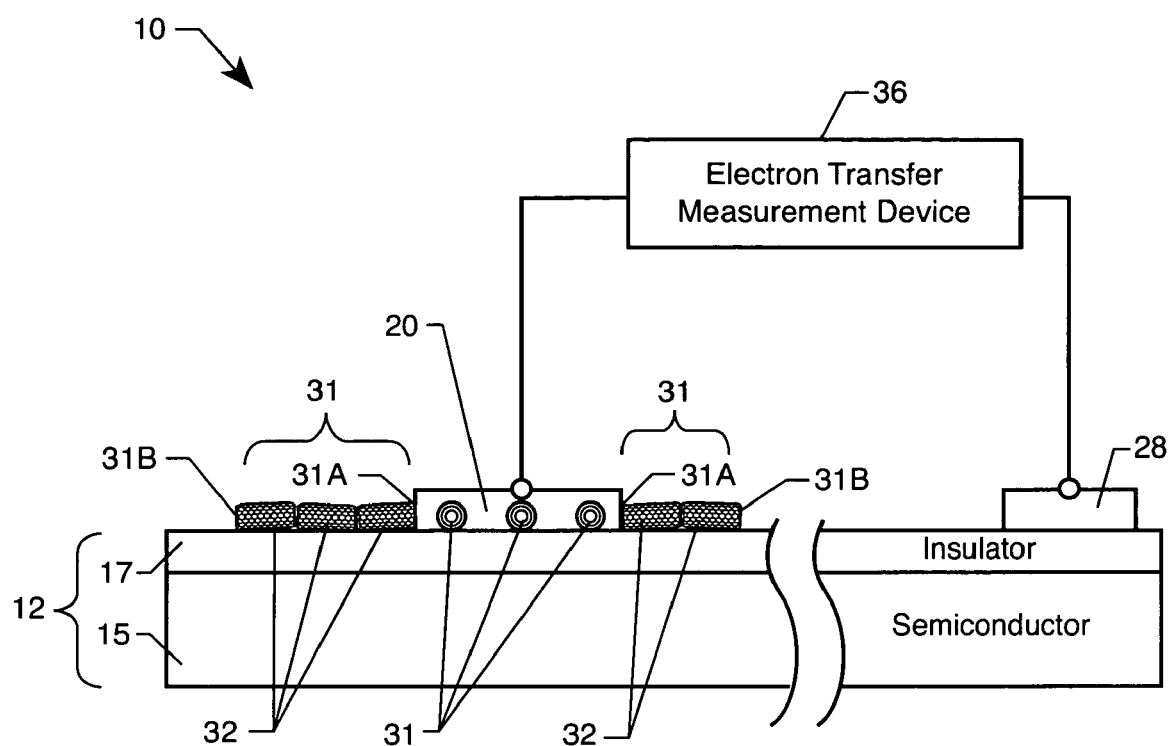
FIG. 1 is a side schematic view of a carbon nanotube (CNT)-based light sensor in accordance with an embodiment of the present invention.

Referring now to the drawings, and more particularly to FIG. 1, a light sensor in accordance with one embodiment of the present invention is illustrated schematically and is referenced generally by numeral 10. The light sensor 10 is shown and will be described herein for purposes of demonstrating the concepts of the present embodiment. However, the particular structure and construction of light sensor 10 can be achieved in a variety of ways without departing from the scope of the present invention.

Light sensor 10 comprises a substrate 12 comprising a semiconductor base 15 and an insulating, non-electrically-conducting layer 17 on a surface of base 15. Typically, semiconductor base 15 is an n-type or p-type silicon-based semiconductor material, i.e., silicon doped with one or more impurities that give the crystal material extra electrons (i.e., n-type) or an electron deficiency (i.e., p-type) as is well known in the art. However, an embodiment could also use other semiconductor materials, e.g., flexible semiconducting polymers. Insulating layer 17 is typically silicon dioxide when semiconductor base 15 is an n-type or p-type silicon-based semiconductor material. Other non-electrically conductive materials, such as silicon nitride, diamond-like-carbon, etc., could also be used without departing from the scope of the present invention.

Positioned on insulating layer 17 is at least one alignment (or first) electrode 20 with a number of carbon nanotube (CNT)-based conductors 31 coupled on one end 31A thereof to electrode 20 and extending from electrode 20 to a second free end 31B. Such positioning could be realized by, for example, depositing the electrode and CNTs directly on layer 17, adhering the electrode and CNTs to layer 17 by means of an adhesive (not shown) interposed therebetween, or otherwise coupling the electrode and CNTs to layer 17 for support thereby.

In general, alignment electrode 20 can be any size or shape that allows CNT-based conductors 31 to extend from electrode 20 while remaining spaced apart from one another as will be explained further below. Each of CNT-based conductors 31 can be defined by a single CNT 32 or multiple CNTs 32 that are coupled to one another in an end-to-end fashion to define an electrically-conductive path. CNTs 32 can be single or multi-wall CNTs with single-wall CNTs being preferred because of their smaller diameter, which serves to increase the chances of establishing and maintaining the spaced-apart relationship between CNT-based conductors 31.

Spaced apart from each free end 31B of CNT-based conductors 31 is a gate (or second) electrode 28 positioned on insulating layer 17. An electron transfer measurement device 36 coupled to electrodes 20 and 28 measures a quantity indicative of the amount of electrons being transferred along all of CNT-based conductors 31. Such electron transfer can be towards or away from electrode 20. For example, for an n-type semiconductor base 15 and p-type CNTs 32, electron transfer will be towards electrode 20. For a p-type semiconductor base 15 and n-type CNTs 32, electron transfer will be away from electrode 20. The amount of electron transfer is proportional to the amount of light impinging on light sensor 10. That is, electron transfer activity increases with the amount of light impinging on light sensor 10. Measurement device 36 can, therefore, be any device capable of detecting the amount of electron transfer. Typically, measurement device 36 is a voltmeter or a current meter.

To achieve the spaced-apart relationship between CNT-based conductors 31, an embodiment defined by alignment electrode 20 and CNT-based conductors 31 can be constructed in accordance with the teachings of U.S. patent application Ser. No. 10/730,188, filed Dec. 4, 2003, entitled "CONTROLLED DEPOSITION AND ALIGNMENT OF CARBON NANOTUBES," the entire contents of which are hereby incorporated by reference. Briefly, this reference provides for the controlled deposition and alignment of carbon nanotubes as follows. A carbon nanotube (CNT) attraction material is deposited on a substrate in a gap region defined between two alignment electrodes on the substrate. An electric potential is applied to the two electrodes. The CNT attraction material is wetted with a solution comprising a carrier liquid having CNTs suspended therein. A portion of the CNTs align with the electric field (which, in the plane of the electrodes, is substantially perpendicular to the edges of the electrodes) and adhere to the CNT attraction material. The carrier liquid and any CNTs not adhered to the CNT attraction material are then removed.

Figure 2:
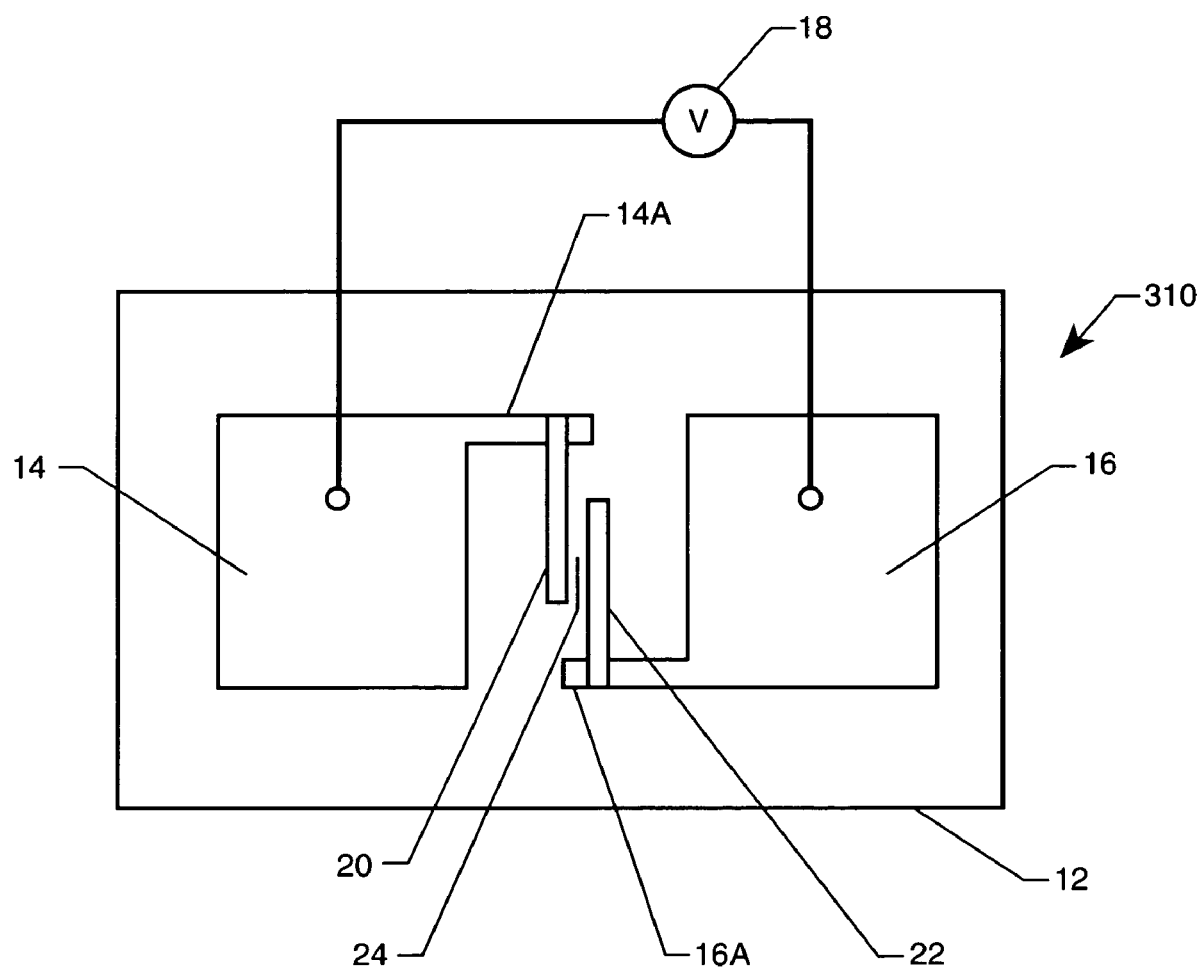
FIG. 2 is a schematic view of an apparatus used in the deposition and alignment of CNTs in accordance with an embodiment of the present invention.

Referring now to FIG. 2, an apparatus used to demonstrate the deposition and alignment of CNTs in accordance with an embodiment of an alignment electrode/CNT-based conductor assembly is shown and referenced generally by numeral 310. Apparatus 310 is shown and will be described herein for purposes of demonstrating an embodiment for construction. However, the particular structure and construction of apparatus 310 can be achieved in other ways without departing from the scope of the present invention.

Apparatus 310 includes a substrate 12 with spaced-apart electrical contact pads 14 and 16 deposited thereon. For example, in terms of many microcircuit applications, substrate 12 is a silicon wafer and contact pads 14 and 16 are any highly conductive material such as gold. Typically, each of contact pads 14 and 16 has a respective electrode contact leg 14A and 16A extending therefrom such that legs 14A and 16A oppose one another as shown. The particular size and shape of the contact pads and legs can be adapted for a particular application as would be understood by one of ordinary skill in the art. Contact pads 14 and 16 are coupled to a voltage source 18 capable of applying an electrical potential thereto. Voltage source 18 can be an alternating current (AC) or direct current (DC) source without departing from the scope of the present invention.

Electrically coupled to leg 14A is an alignment electrode 20 and electrically coupled to leg 16A is an alignment electrode 22. Electrodes 20 and 22 are deposited on substrate 12 such that portions thereof oppose one another with a gap 24 being defined therebetween. Alignment electrodes 20 and 22 can be, but are not required to be, parallel to one another. Additional opposing pairs of electrodes can be provided without departing from the scope of the present invention.

Figure 5:
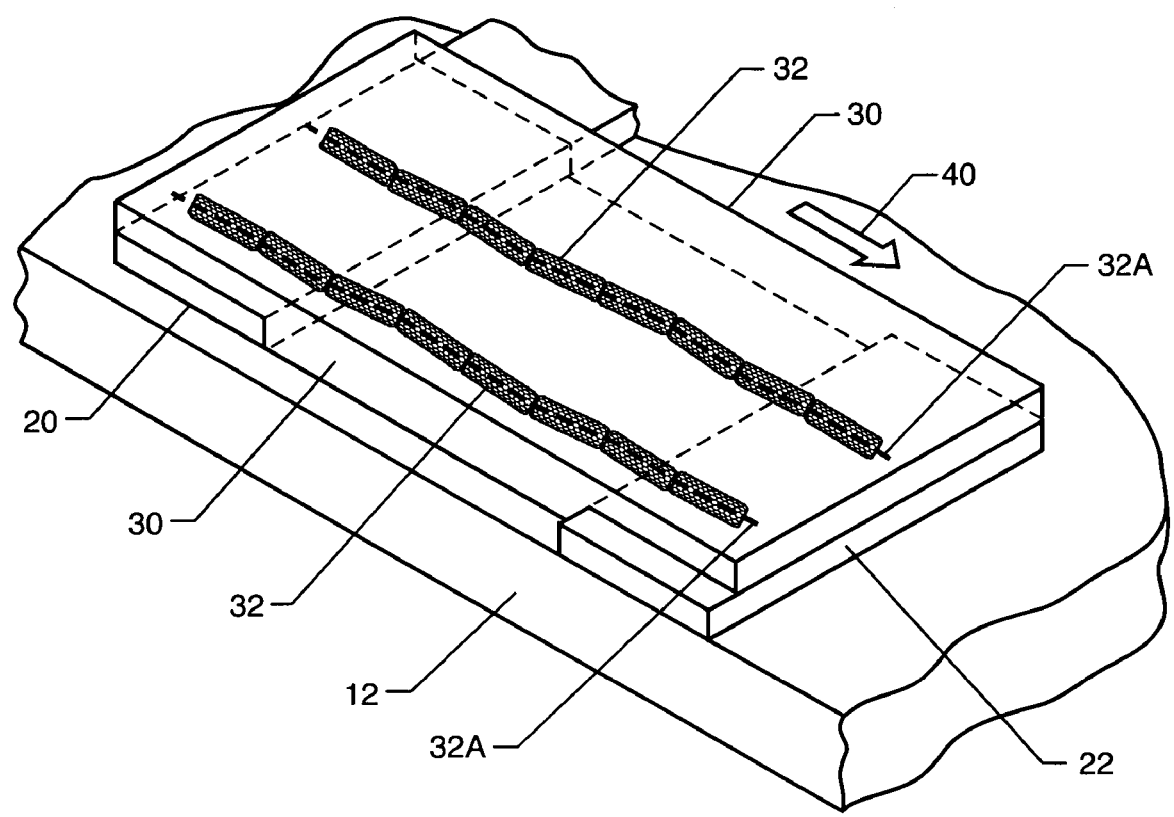
FIG. 5 is a perspective view of a portion of the apparatus in FIG. 2 depicting the CNT attraction material with the CNTs being deposited and aligned on and between the electrodes of the apparatus in accordance with another embodiment of the present invention.

In general, the embodiment modifies apparatus 310 by (i) specific placement thereon of a material that attracts CNTs thereto, and (ii) deposition and alignment of CNTs on the specifically-placed CNT attraction material such that the CNTs provide good electrical conductivity between aligned CNTs. At a minimum, and as will be explained with reference to FIG. 3, the CNT attraction material is positioned between electrodes 20 and 22, i.e., in gap 24. However, the CNT attraction material can further be deposited on and between electrodes 20 and 22 (and beyond the electrodes if so desired) as will be explained later below with reference to FIG. 5. The CNTs deposited and aligned by the present embodiment can be single or multi-wall CNTs. However, because of their remarkable strength, single-wall CNTs (SWCNTs) will be preferred for most applications.

Figure 3:
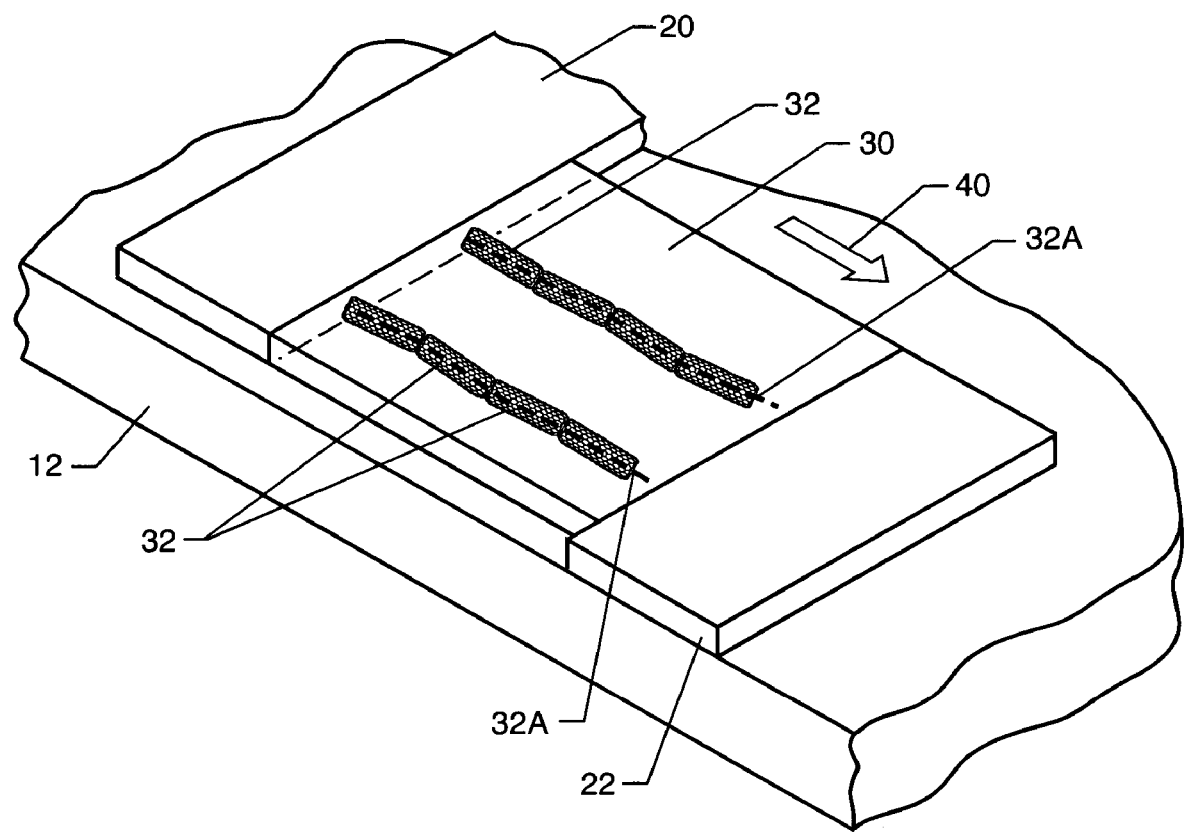
FIG. 3 is a perspective view of a portion of the apparatus in FIG. 2 depicting the CNT attraction material and CNTs deposited and aligned between the electrodes of the apparatus in accordance with an embodiment of the present invention.

Referring additionally now to FIG. 3, a perspective view of a portion of substrate 12 with electrodes 20 and 22 deposited thereon is shown. In accordance with the present embodiment, a CNT attraction material 30 is deposited in the gap between opposing portions of alignment electrodes 20 and 22. At least one CNT 32 is coupled to material 30 and aligned such that each tube axis 32A is substantially perpendicular to electrodes 20 and 22 to define an electrical conduction path between aligned ones of CNTs 32. If the ultimate application of aligned CNTs is to use the alignment electrodes 20 and 22 along with aligned CNTs in an electrical conduction path, the aligned ones of CNTs 32 must contact each of electrodes 20 and 22. However, it is to be understood that the present embodiment does not require that aligned ones of CNTs 32 contact both electrodes 20 and 22. That is, the electrical conduction path defined by aligned ones of CNTs 32 could be used to conduct between elements (not shown) deposited on and/or across aligned ones of CNTs 32. Similarly, as will be discussed further below, the aligned CNTs could be used while in contact with only one of electrodes 20 and 22.

For clarity of illustration, the size of CNTs 32 is greatly exaggerated and only two sets of aligned CNTs are shown. However, as would be understood by one of ordinary skill in the art, many more sets of aligned CNTs would be present in the actual device. Furthermore, if spacing between electrodes 20 and 22 is small (e.g., less than one micron), it is possible for a single one of CNTs 32 to span between electrodes 20 and 22.

To achieve the structure illustrated in FIG. 3, apparatus 310 is first processed to specifically place CNT attraction material 30 in its desired location(s). While a variety of methods can be used to deposit CNT attraction material 30, one method will be described herein by way of an illustrative example. The area of apparatus 310 to receive CNT attraction material 30 can be spin coated with a resist material (e.g., poly(methylmethacrylate) or PMMA, polymethylglutarimide, etc.) and then patterned with an electron beam to define the desired "receive" location(s) (e.g., gap 24). After cleaning (e.g., in an oxygen plasma), CNT attraction material 30 is deposited on the surface of apparatus 310. The resist material (as well as the portion of CNT attraction material 30 deposited thereon) is then removed (e.g., using standard cleaning procedures) thereby leaving CNT attraction material only in the receive location(s) such as gap 24.

CNT attraction material 30 can be any material that suitably attracts and adheres CNTs thereto. Such a material can have an amino-terminated surface that will form a hydrogen bond with one or more hydrogen molecules found on the sidewall of a CNT. Accordingly, CNT attraction material 30 can be a monolayer material such as a self-assembled monolayer (SAM) of amino-terminated moieties. In terms of the structure shown in FIG. 3, wherein CNT attraction material 30 adheres only to the substrate 12 between electrodes 20 and 22, an example of a commercially-available CNT attraction material is aminopropyltriethoxysilane or APTES. APTES does not bond to metal, which electrodes 20 and 22 may be made of. However, other suitable monolayers can be used without departing from the scope of the present invention. For example, if CNT attraction material 30 is also to be deposited and adhered to electrodes 20 and 22 (as is the case with the structure shown in FIG. 5), a thiol-type of SAM can be used.

In terms of the APTES monolayer, when it comes into contact with a silicon oxide surface (i.e., the surface of a typical substrate 12), it orients itself through a self-assembly process so that the amino (—NH2) head group is pointing away from the surface of the substrate. Several different reactions resulting in different anchoring mechanisms can occur when APTES comes into contact with carboxyl (—COO) and hydroxyl (—OH) groups on the sidewall surface of CNTs. For example, with the correct selection of CNT processing and monolayer selection, a hydrogen bond forms between the monolayer and the carboxyl/hydroxyl group in the sidewall of the CNT. The carboxyl and hydroxyl groups on the nanotube surface contain a partially negative charge, while the amino head-group on the APTES is partially positive. Thus, the charges will attract, and an electrostatic bond can form. Specifically, the electron from the APTES headgroup is partially shared with the carboxyl and/or hydroxyl group on the CNT's surface. Covalent bonds could also be created by performing an aminolysis reaction so that the carboxyl groups will form an amide (—COONH—) linkage with the monolayer, although this reaction would require the use of a catalyst.

As mentioned above, the monolayer does not need to be APTES. Any monolayer that would react with the carboxyl/hydroxyl groups on the CNT sidewall could be selected. Examples include monolayers that have a hydroxyl head-group (e.g., hydrogen bonding with the carboxyl groups and some with the hydroxyl groups) or a carboxyl head-group (e.g., more hydrogen bonding and esterification with the hydroxyl side groups could be performed to create covalent bonds, i.e., a —COOC— bond). Also, choosing monolayers that have no reactive headgroups (e.g., octadecyltrichlorosilane or OTS) can be used to "shield" the surface from nanotube attachment. Additionally, the carboxyl/hydroxyl groups on the CNT sidewalls can be modified directly to enhance or prohibit their attachment to surfaces. For example, modifying a CNT so that the sidewall thereof is functionalized with a thiol group (—SH) would cause it to attach to a gold surface.

Figure 4:
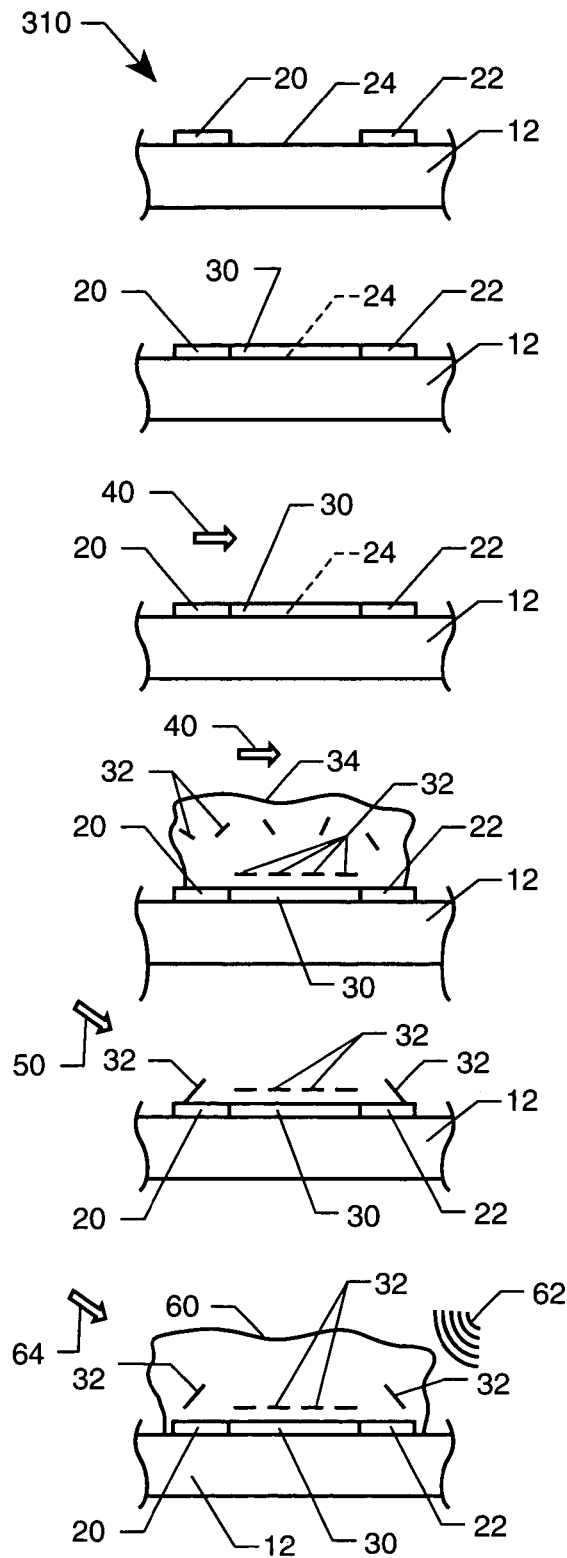
FIG. 4 schematically depicts the sequence of steps and results achieved thereby during the deposition and alignment of CNTs in accordance with the present invention.
Figure 4:
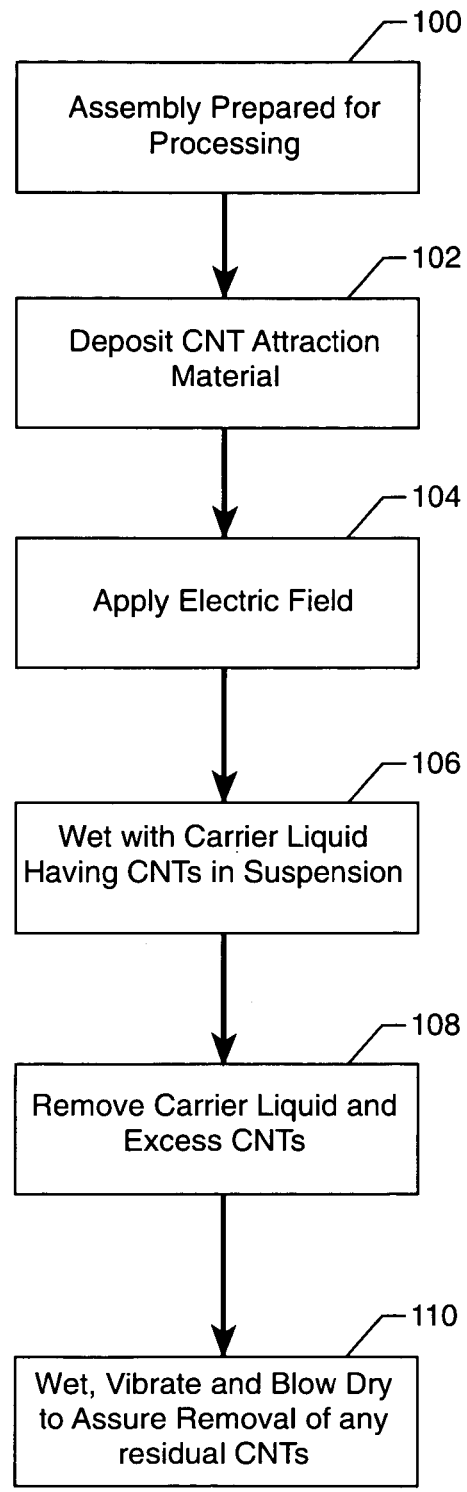

With additional reference now to FIG. 4, the sequence of steps used in the present invention (to create the structure shown in FIG. 3) are characterized in schematic form with a brief description thereof being provided in the corresponding box of the flowchart that is beside the description. For simplicity, a side view of only the relevant portion of apparatus 310 is shown at each step of the sequence.

At step 100, apparatus 310 is prepared for processing such that electrodes 20 and 22 are placed on substrate 12 with gap 24 defined therebetween. Once CNT attraction material 30 has been deposited in its desired location(s) at step 102, voltage source 18 is activated at step 104 so that an electric field is generated between electrodes 20 and 22 and across CNT attraction material (in gap 24) as indicated by arrow 40. To insure good alignment of CNTs 32 falling between electrodes 20 and 22, it is suggested that voltage source 18 be activated before the deposition of the solution-suspended CNTs 32 at step 106. However, for some applications it may be desirable to activate voltage source 18 at the same time as, or just after, the deposition of the solution-suspended CNTs 32. Note that the direction of electric field 40 depends on the polarity of the electric potentials applied to alignment electrodes 20 and 22.

Next, at step 106, a quantity of CNTs 32 suspended in a carrier liquid solution 34 are deposited on apparatus 310 on and around CNT attraction material 30. Carrier liquid 34 is chosen so that the CNTs do not clump together. CNTs tend to clump together in solution due to strong van der Waals forces between individual CNTs. These forces are directly related to the size of the CNTs as well as the distance therebetween. The best solvent to disperse particular CNTs also depends on the origin of the CNTs (e.g., vendor, batch or lot, etc.) and how the CNTs have been processed (e.g., cut with nitric acid to form functionalized sidewalls, purified, etc.). Given these variables, several different solvents may be used, such as toluene, n-methylprolidone (NMP), dichloromethane (DCM), dimethylforamide (DMF), and even water that contains various surfactants (e.g., Triton X-100, sodium dodecylsulfate, and others as would be well understood in the art). In general, the carrier liquid should minimize van der Waals forces between the CNTs suspended therein. Furthermore, when mixing the CNTs in the carrier liquid, ultrasonic energy can be used to help disperse the CNTs therein.

By virtue of this process, those of the solution-suspended CNTs that come into contact with CNT attraction material 30 (i) already have their tube axis 32A substantially aligned with the direction of electric field 40 as illustrated in FIG. 3, and (ii) adhere thereto in an aligned fashion by means of hydrogen bonding with the sidewall of CNTs 32. After a brief period of time (e.g., ranging from tens of seconds to several minutes with CNT densities being proportional to exposure time), electric field 40 is removed as well as any remaining liquid solution and CNTs not adhered to CNT attraction material 30, thereby leaving CNTs 32 aligned and adhered on CNT attraction material 30 as shown in FIG. 3.

Removal of the liquid carrier and CNTs suspended therein can simply involve blowing (as indicated by arrow 50 in step 108) of an inert gas such as nitrogen across the surface of apparatus 310 (with CNT attraction material 30 and CNTs 32 deposited thereon) until dry. To assure the removal of any CNTs 32 left in areas other than on CNT attraction material 30, additional processing can be implemented at step 110. Specifically, a rinse liquid 60 (e.g., n-methylrolidone) is washed over the apparatus as it is vibrated (e.g., sonification by acoustic wave energy 62) thereby causing the non-adhered ones of CNTs 32 to become suspended in rinse liquid 60. An inert gas (e.g., nitrogen) is then used to blow off the rinse liquid and suspended CNTs as indicated by arrow 64. As a result, the structure shown in FIG. 3 is achieved. The embodiment provides for the controlled deposition and alignment of CNTs such that their electrical conductive properties can be exploited.

As mentioned above, and as shown in FIG. 5, the final product produced by the present embodiment could have CNT attraction material 30 deposited on electrodes 20 and 22 as well as therebetween. This approach is achieved by proper selection of CNT attraction material 30 for adherence to (metal) electrodes 20 and 22. In this example, CNTs 32 will be adhered to and aligned on CNT attraction material 30 both over and between electrodes 20 and 22. The processing steps for achieving this structure are identical to that described above. If electrical contact is desired between electrodes 20 and 22 and ones of CNTs 32 positioned thereover, an additional step of ultraviolet ozone cleaning can be applied to the appropriate areas on electrodes 20 and 22 after removal of the carrier liquid and excess CNTs.

The embodiment of FIG. 1 can utilize the teachings of U.S. patent application Ser. No. 10/730,188 to position CNT-based conductors 31 such that they are coupled on one end 31A to alignment electrode 20 and extend away therefrom in a spaced-apart fashion to a second free end 31B. For example, by applying an electric field across alignment electrodes 20 and 22 (with CNTs 32 deposited only in the vicinity of one alignment electrode 20), CNTs 32 will align themselves (in the plane of electrode 20) with the electric field lines extending out from and substantially perpendicular to the edges of electrode 20. The length of CNT-based conductors 31 can be controlled/optimized for a particular light sensor by controlling (i) the lengths of CNTs 32, and/or (ii) the length of time that the alignment electric field is applied to the alignment electrodes 20 and 22. For example, if the alignment electric field is applied very briefly, each of CNT-based conductors might comprise a single CNT 32.

As mentioned previously, electron transfer toward or away from electrode 20 increases with the amount of light impinging on light sensor 10. Because electrons must transfer between semiconductor base 15 and electrode 20, insulating layer 17 must support such electron transfer. This support can be facilitated by selecting the proper thickness for insulating layer 17 and/or by the localized breakdown of layer 17 at free ends 31B brought on by the process of CNT alignment. That is, the electric potential applied during the alignment process generates an enhanced electric field at free ends 31B owing to the small diameters of the CNTs 32. The increased electric field at free ends 31B breaks down layer 17 to facilitate electron transfer therethrough.

Figure 6A:
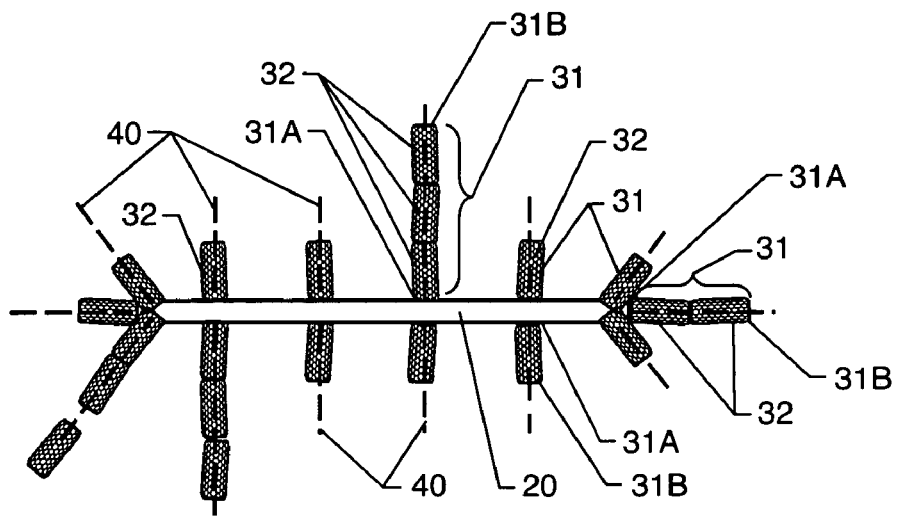
FIG. 6A is an isolated plan view of a shaped electrode with CNTs coupled thereto in accordance with an embodiment of the present invention.
Figure 6B:
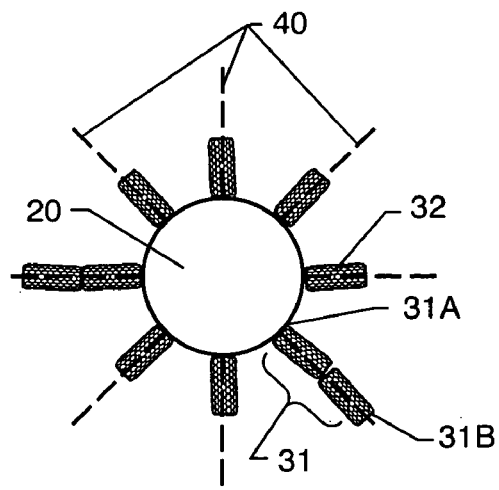
FIG. 6B is an isolated plan view of a shaped electrode with CNTs coupled thereto in accordance with another embodiment of the present invention.
Figure 6C:
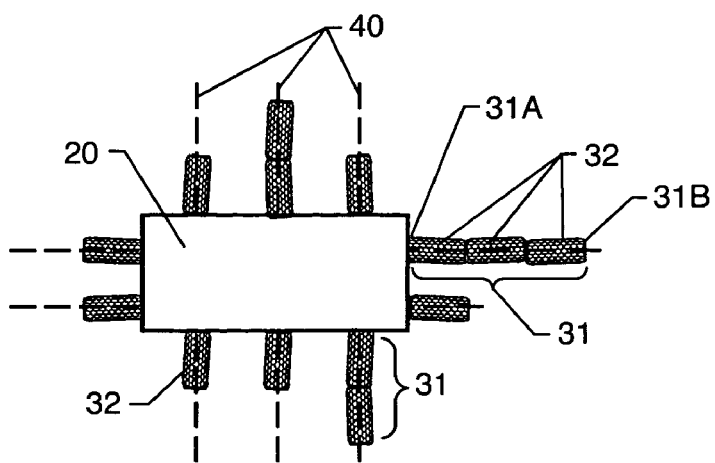
FIG. 6C is an isolated plan view of a shaped electrode with CNTs coupled thereto in accordance with yet another embodiment of the present invention.

As mentioned above, the size and shape of electrode 20 can be any that will facilitate the spaced-apart positioning of CNT-based conductors 31 coupled thereto. FIGS. 6A–6C show isolated top views of alternate embodiments of the electrode 20. In FIG. 6A, electrode 20 is a narrow strip or line electrode with one or both (as shown) of its opposing ends converging to a pointed tip. An electric field applied to electrode 20 will extend (in the plane of electrode 20) out from and substantially perpendicular to the edges thereof as indicated by dashed lines 40. CNTs 32 will align themselves with field lines 40 to form single CNT and/or multiple CNT types of CNT-based conductors 31. The small features of a line electrode make this embodiment work well when size of the light sensor is of concern. FIG. 6B depicts a circular electrode 20 and FIG. 6C depicts a rectangular electrode 20. From the above description, a skilled artisan would recognize that electrode 20 can be a variety of other shapes (e.g., triangular, pentagonal, octagonal, etc.) without departing from the scope of the present invention.

During operation of the embodiment, the light sensor 10 is passive and does not require a biasing or interrogating voltage. An increased amount of impinging light will increase the amount of electron transfer activity detected by measurement device 36. The embodiment provides a light sensor of small size and weight to be constructed for use in a variety of optical devices, such as optical switches, imaging devices, etc.

Figure 7:
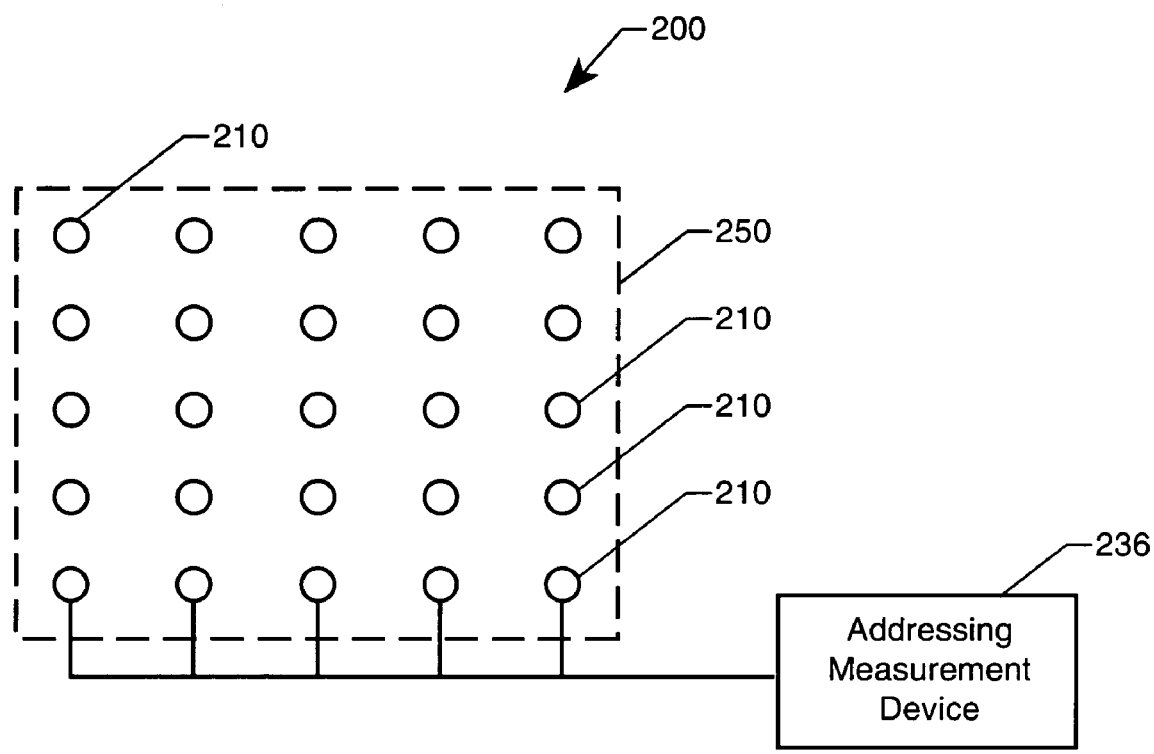
FIG 7 is a schematic plan view of an embodiment of a multi-element light sensor system constructed from an array of CNT-based light sensors in accordance with another embodiment of the present invention.

The present embodiment of FIG. 1 can be extended to the construction of light sensors utilizing more than one "electrode 20/CNT-based conductors 31" assembly. For instance, a multi-element light sensor system 200 can be constructed from an array of "electrode 20/CNT-based conductors 31" assemblies. Such an embodiment is illustrated in FIG. 7 where an array 250 of light sensor elements based on the "electrode 20/CNT-based conductors 31" assembly of light sensor 10 is provided. In this plan view, each "electrode 20/CNT-based conductors 31" assembly is represented generally by reference numeral 210. While assembly 210 is represented for clarity of illustration as being circular in shape, assembly 210 may comprise a line electrode as shown in FIG. 6A, a circular electrode as shown in FIG. 6B, a rectangular electrode as shown in FIG. 6C, or any other shape. Further, any combination of electrode shapes (circular and line, line and rectangular, line, circular, and rectangular, etc.) could be used to construct such a sensing array.

Each assembly 210 is uniquely addressable and can have its electron transfer amounts detected or measured by addressing measurement device 236. That is, measurement device 236 functions as an individual measuring device (analogous to measurement device 36 described earlier) for each assembly 210.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A light sensor comprising:
    a substrate comprising a base made from a semi-conductive material and a layer of an electrically non-conductive material on a surface of said base;
    at least one alignment electrode on said layer;
    a plurality of carbon nanotube (CNT)-based conductors on said layer and distributed in a spaced apart fashion about a periphery of said at least one alignment electrode with each of said plurality of CNT-based conductors coupled on one end thereof to said at least one alignment electrode and extending away from said at least one alignment electrode to terminate at a second end thereof, each of said plurality of CNT-based conductors comprising at least one CNT;
    at least one gate electrode on said layer and spaced apart from said second end of each of said plurality of CNT-based conductors; and
    means, coupled to said at least one alignment electrode and said at least one gate electrode, for detecting a quantity indicative of electron transfer along said plurality of CNT-based conductors, wherein said electron transfer is indicative of an amount of light impinging on said plurality of CNT-based conductors.

2. A light sensor as in claim 1 wherein said semi-conductive material is silicon doped with at least one impurity.

3. A light sensor as in claim 2 wherein said at least one impurity is selected to make said semi-conductive material a p-type semiconductor.

4. A light sensor as in claim 2 wherein said at least one impurity is selected to make said semi-conductive material an n-type semiconductor.

5. A light sensor as in claim 1 wherein said electrically non-conductive material is selected from the group consisting of silicon dioxide and silicon nitride.

6. A light sensor as in claim 1 wherein said semi-conductive material is silicon based and said electrically non-conductive material is silicon dioxide.

7. A light sensor as in claim 1 wherein each said CNT is a single-wall CNT.

8. A light sensor as in claim 1 wherein said detecting means comprises a voltmeter.

9. A light sensor as in claim 1 wherein said detecting means comprises a current meter.

10. A light sensor as in claim 1 wherein said at least one alignment electrode comprises at least one strip of electrically conductive material converging to at least one pointed tip.

11. A light sensor comprising:
a substrate comprising a base made from a silicon-based material with a layer of silicon dioxide on a surface of said base;
at least one alignment electrode on said layer;
a plurality of carbon nanotube (CNT)-based conductors on said layer and distributed in a spaced apart fashion about a periphery of said at least one alignment electrode with each of said plurality of CNT-based conductors coupled on one end thereof to said at least one alignment electrode and extending away from said at least one alignment electrode to terminate at a second end thereof, each of said plurality of CNT-based conductors comprising at least one CNT;
a gate electrode on. said layer and spaced apart from said second end of each of said plurality of CNT-based conductors; and
means, coupled to said at least one alignment electrode and said gate electrode, for detecting a quantity indicative of electron transfer along said plurality of CNT-based conductors, wherein said electron transfer is indicative of an amount of light impinging on said plurality of CNT-based conductors.

12. A light sensor as in claim 11 wherein said detecting means comprises a voltmeter.

13. A light sensor as m claim 11 wherein said detecting means comprises a current meter.

14. A light sensor as in claim 11 wherein said at least one alignment electrode comprises at least one strip of electrically conductive material converging to at least one pointed tip.

15. A light sensor comprising:
a substrate comprising a base made from a semi-conductive material and a layer of an electrically non-conductive material on a surface of said base;
at least one alignment electrode on said layer;
a plurality of carbon nanotube (CNT) conductors on said layer and distributed in a spaced apart fashion about a periphery of said at least one alignment electrode with each of said plurality of CNT conductors coupled on one end thereof to said at least one alignment electrode and extending away from said at least one alignment electrode to terminate at a second end thereof, each of said plurality of CNT conductors comprising at least one CNT;
said electrically non-conductive material being configured to facilitate electron transfer therethrough so as to permit the transfer of electrons between said semi-conductive material and said at least one alignment electrode;
a gate electrode on said layer and spaced apart from said second end of each of said plurality of CNT conductors; and
means, coupled to said at least one alignment electrode and said gate electrode, for detecting a quantity indicative of electron transfer along said plurality of CNT conductors, wherein said electron transfer is indicative of an amount of light impinging on said plurality of CNT conductors.

16. A light sensor as in claim 15 wherein said semi-conductive material is silicon doped with at least one impurity.

17. A light sensor as in claim 16 wherein said at least one impurity is selected to make said semi-conductive material a p-type semiconductor.

18. A light sensor as in claim 16 wherein said at least one impurity is selected to make said semi-conductive material an n-type semiconductor.

19. A light sensor as in claim 15 wherein said electrically non-conductive material is selected from the group consisting of silicon dioxide and silicon nitride.

20. A light sensor as in claim 15 wherein said detecting means comprises a voltmeter.

21. A light sensor as in claim 16 wherein said detecting means comprises a current meter.

22. A light sensor as in claim 16 wherein said at least one alignment electrode comprises at least one strip of electrically conductive material converging to at least one pointed tip.

23. A light sensor comprising:
a substrate comprising a base made from a silicon-based material with a layer of silicon dioxide on a surface of said base;
at least one alignment electrode on said layer;
a plurality of carbon nanotube (CNT) conductors on said layer and distributed in a spaced apart fashion about a periphery of said at least one alignment electrode with each of said plurality of CNT conductors coupled on one end thereof to said at least one alignment electrode and extending away from said at least one alignment electrode to terminate at a second end thereof, each of said plurality of CNT conductors comprising at least one CNT;
said silicon dioxide layer being configured to facilitate electron transfer therethrough so as to permit the transfer of electrons between said silicon-based material and said at least one alignment electrode;
a gate electrode positioned on said layer of silicon dioxide and spaced apart from said second end of each of said plurality of CNT conductors; and
means, coupled to said at least one alignment electrode and said gate electrode, for detecting a quantity indicative of electron transfer along said plurality of CNT conductors wherein said electron transfer is indicative of an amount of light impinging on said plurality of CNT conductors.

24. A light sensor as in claim 23 wherein said detecting means comprises a voltmeter.

25. A light sensor as in claim 23 wherein said detecting means comprises a current meter.

26. A light sensor as in claim 23 wherein said at least one alignment electrode comprises at least one strip of electrically conductive material converging to at least one pointed tip.

27. A light sensor comprising:
- a substrate comprising a base made from a semi-conductive material and a layer of an electrically non-conductive material on a surface of said base;
- at least one electrode/carbon nanotube (CNT)-based conductor assembly positioned on said layer, each electrode/CNT-based conductor assembly comprising at least one alignment electrode and a plurality of CNT-based conductors positioned on said layer, said plurality of CNT-based conductors distributed in a spaced apart fashion about a periphery of said alignment electrode with each of said plurality of CNT-based conductors coupled on one end thereof to said alignment electrode and extending away from said alignment electrode to terminate at a second end thereof, each of said plurality of CNT-based conductors comprising at least one CNT;
- at least one gate electrode on said layer and spaced apart from said second end each of each of said plurality of CNT-based conductors;
- said electrically non-conductive material being configured to support electron transfer therethrough so as to permit the transfer of electrons between said semi-conductive material and said at least one electrode/CNT-based conductor assembly; and
- means, coupled to said at least one electrode/CNT-based conductor assembly and said at least one gate electrode, for detecting a quantity indicative of electron transfer for each electrode/CNT-based conductor assembly, wherein said electron transfer is indicative of an amount of light impinging each electrode/CNT-based conductor assembly.

28. A light sensor as in claim 27 wherein said semi-conductive material is silicon doped with at least one impurity.

29. A light sensor as in claim 28 wherein said at least one impurity is selected to make said semi-conductive material a p-type semiconductor.

30. A light sensor as in claim 28 wherein said at least one impurity is selected to make said semi-conductive material an n-type semiconductor.

31. A light sensor as in claim 27 wherein said electrically non-conductive material is selected from the group consisting of silicon dioxide and silicon nitride.

32. A light sensor as in claim 27 wherein said semi-conductive material is silicon based and said electrically non-conductive material is silicon dioxide.

33. A light sensor as in claim 27 wherein each said CNT is a single-wall CNT.

34. A light sensor as in claim 27 wherein said detecting means comprises a voltmeter.

35. A light sensor as in claim 27 wherein said detecting means comprises a current meter.

36. A light sensor as in claim 27 wherein said at least one alignment electrode comprises at least one strip of electrically conductive material converging to at least one pointed tip.

* * * * *